(12) United States Patent  (10) Patent No.: US 7,745,731 B2
Kobayashi et al.  (45) Date of Patent: Jun. 29, 2010

(54) TRANSMISSION CABLE

(75) Inventors: Kazuyoshi Kobayashi, Tochigi (JP);
Kenichiro Hanamura, Tochigi (JP);
Tomomitsu Hori, Tochigi (JP)

(73) Assignees: Sony Corporation, Tokyo (JP); Sony Chemical & Information Device Corporation, Tokyo (JP)

( * ) Notice: Subject to any disclaimer, the term of this patent is extended or adjusted under 35 U.S.C. 154(b) by 107 days.

(21) Appl. No.: 12/111,317

(22) Filed: Apr. 29, 2008

(65) Prior Publication Data

US 2008/0230254 A1 Sep. 25, 2008

Related U.S. Application Data

(63) Continuation of application No. 11/619,039, filed on Jan. 2, 2007, now Pat. No. 7,429,702, which is a continuation of application No. PCT/JP2005/000145, filed on Jan. 7, 2005.

(30) Foreign Application Priority Data

Jun. 30, 2004 (JP) .............................. 2004-194981

(51) Int. Cl.
*H01B 7/08* (2006.01)

(52) U.S. Cl. ................................. 174/117 FF; 174/262
(58) Field of Classification Search ............ 174/117 FF, 174/250, 262
See application file for complete search history.

(56) References Cited

U.S. PATENT DOCUMENTS 4,845,311 A * 7/1989 Schreiber et al. .............. 174/36

FOREIGN PATENT DOCUMENTS

JP 11-162267 * 6/1999

* cited by examiner

*Primary Examiner*—Chau N Nguyen
(74) *Attorney, Agent, or Firm*—K&L Gates LLP

(57) ABSTRACT

A transmission cable and method for manufacturing same are provided. A plurality of signal lines are formed on one side of an insulating layer and ground lines are formed between the signal lines. The ground lines are electrically connected with a shield layer formed on a back surface of the insulating layer through metal bumps formed and embedded in the insulating layer. Insulating layers and shield layers may be formed on opposite sides sandwiching the signal lines and the ground lines. In this case, the ground lines are electrically connected with the shield layers, respectively, through metal bumps on both sides thereof. Consequently, a highly reliable transmission cable capable of high rate transfer and large capacity transfer can be provided.

2 Claims, 3 Drawing Sheets

TRANSMISSION CABLE

CROSS REFERENCE TO RELATED APPLICATIONS

The present application is a continuation of U.S. patent application Ser. No. 11/619,039, filed on Jan. 2, 2007, which is a continuation of International Application No. PCT/JP2005/000145 filed Jan. 7, 2005, and which claims priority to Japanese Patent Document No. 2004-194981, filed on Jun. 30, 2004. The entire disclosure of the prior applications are hereby incorporated by reference herein in entirety.

BACKGROUND

The present application generally relates to a transmission cable. More particularly, the present application relates to a transmission cable which involves interlayer connections using bumps, and further relates to a manufacturing method thereof.

Data and the like is transferred over various types of networks via transmission cables (network cables), and flat transmission cables which are easily laid have been developed. Flat transmission cables are made by patterning signal lines using a method similar to that used with so-called flexible wiring substrates, and have the advantage that differences in level are not formed in a location such as underneath flooring materials where wiring is installed.

Incidentally, the coming of the broadband era has created a need for high speed and large capacity transfer, and improvements to the transmission cables mentioned above are desired. For example, a serious problem is caused by malfunctioning due to noise and mutual cross-interference of signals with transmission cables formed simply of signal lines.

Due to these circumstances, transmission cables have been proposed with a design in which ground lines are disposed between signal lines which are electrically connected to a shield layer formed via an insulating layer. A flat cable is disclosed in which shield patterns and shield layers are electrically connected by conductive bumps formed from a conductive resin paste. See, for example, Japanese Patent laid-open publication No. 11-162267.

However, conductive paste has the problems of having high electrical resistance and high connection resistance with the copper foil which makes up the ground lines. Such high electrical resistance and connection resistance prevent the ground lines from fully functioning and make it impossible to fully eliminate noise and interference between signal lines. This is a serious obstacle to the increased speeds mentioned above.

Furthermore, employing a manufacturing process of forming conductive bumps using the conductive paste and force-inserting these bumps into and through an insulating material layer leads to a problem of increased manufacturing costs. For example, with the technology described in Japanese Patent laid-open publication No. 11-162267, conductive bumps are formed on predetermined locations on a stainless steel plate using, for example, a stamping method designed to pressurize a conductive composition (a paste) contained in a casing and extrude it through holes in a mask. In this case, special equipment such as a stamping machine is needed, and there is also a need to repeat a printing and drying process at the same position, and also to perform a heat hardening process, rendering the process complex.

SUMMARY

The present application is proposed in view of these circumstances. Specifically, the present application provides in an embodiment a highly reliable transmission cable capable of suppressing increases in electrical resistance and connection resistance between ground lines and a shield layer, and fully eliminating noise and interference between signal lines, thereby enabling high speed transfer and large capacity transfer. Furthermore, the present application provides in an embodiment a transmission cable manufacturing method allowing simple formation of highly reliable bumps for connection employing existing ordinary wiring substrate processes, thereby simplifying the manufacturing process and reducing manufacturing costs.

In an embodiment, a transmission cable is provided, wherein a plurality of signal lines are formed on one side of an insulating layer and ground lines are formed between the signal lines; and the ground lines are electrically connected with a shield layer formed on a back surface of the insulating layer through metal bumps embedded in the insulating layer. The present application provides a transmission cable having a plurality of signal lines, a ground line positioned between the signal lines, a first insulating layer having the signal lines and the ground lines formed on its one side, a first metal bump embedded in the first insulating layer and a first shield layer formed on the other side of the first insulating layer, wherein the ground lines are electrically connected with the first shield layer through the first metal bumps. Furthermore, the present application provides the transmission cable further having a second insulating layer having the signal lines and the ground lines formed on its one side, a second metal bump embedded in the second insulating layer, and a second shield layer formed on the other side of the second insulating layer, wherein the ground lines are electrically connected with the second shield layers via the second metal bumps. In this embodiment, the ground lines and the signal lines are interposed between the first insulating layer and the second insulating layer.

Furthermore, a method for manufacturing a transmission cable according to an embodiment is provided by forming metal bumps via etching a bump forming copper foil on a clad material in which an etching barrier layer and the bump forming copper foil are laminated on a copper foil, overlaying a wiring forming copper foil on the clad material via an insulating layer such that top end surfaces of the metal bumps contact with the wiring forming copper foil, forming a resist layer having a predetermined pattern on the overlaid wiring forming copper foil, and etching the wiring forming copper foil with the resist layer as a mask and patterning signal lines and ground lines.

With the transmission cable of an embodiment, the metal bumps which enable interlayer connection between the ground lines and the shield layer are metal bumps formed by etching a copper foil, for example. Accordingly, since it is formed from metal, it has low electric resistance. Furthermore, the metal bumps and the ground lines, or the metal bumps and the shield layer involve metal-to-metal contact. Accordingly, connection resistance between them is suppressed to a low value.

Thus, with the transmission cable of an embodiment, the ground lines function effectively as a shield, reliably eliminating interference between signal lines and intrusion of noise, because the electrical resistance of the bumps themselves, which perform interlayer connection, and the connection resistance between the bumps and the ground lines or the shield layer are held down.

On the other hand, when the manufacturing method is considered, the metal bumps are formed by etching a copper foil, for example. Etching is a common technology in patterning of wiring and the like, and metal bumps are easily formed by employing it. Furthermore, etching equipment used in manufacturing wiring substrates can simply be used as is, and special equipment for bump forming, such as stamping machines, is unnecessary.

With the present application, increases in electrical resistance and in connection resistance can be suppressed between the ground line and the shield layer, and noise and interference between the signal lines can be fully eliminated. Accordingly, a highly reliable transmission cable can be provided which is capable of high speed transfer and large capacity transfer.

Furthermore, with the manufacturing method of the present application, highly reliable connection bumps can be formed simply using ordinary wiring substrate processes. Accordingly, the manufacturing process can be simplified and manufacturing costs can be reduced when manufacturing transmission cables capable of high speed transfer and large capacity transfer.

Additional features and advantages are described herein, and will be apparent from, the following Detailed Description and the figures.

BRIEF DESCRIPTION OF THE FIGURES

FIG. 2a is a diagram showing a clad material; FIG. 2b is a diagram showing a resist film forming step; FIG. 2c is a diagram showing a metal bump forming step; FIG. 2d is a diagram showing a resist layer removal step; FIG. 2e is a diagram showing an insulating layer forming step; FIG. 2f is a diagram showing a wiring forming copper foil pressure bonding step; FIG. 2g is a diagram showing a wiring pattern forming resist forming step; FIG. 2h is a diagram showing a wiring pattern etching step; and FIG. 2i is a diagram showing a resist layer removal step.

DETAILED DESCRIPTION

In the following, a transmission cable and a manufacturing method thereof according to an embodiment are described in detail with reference to the drawings.

Figure 1:
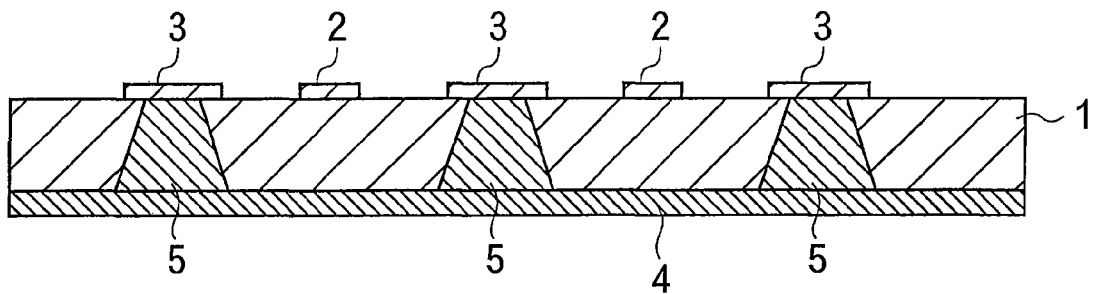
FIG. 1 is a schematic cross-section showing a relevant part of an example of a transmission cable according to an embodiment.

FIG. 1 shows a construction of a transmission cable. In this transmission cable, signal lines 2 and ground lines 3 are formed on one surface, here an upper surface, of an insulating layer 1 acting as a substrate. The signal lines 2 are used in transmission of various signals, such as data transmission, and form the core of the transmission cable.

With the signal lines 2, malfunctioning due to intrusion of noise, for example, is a problem, and cross-interference between the signal lines 2 is also a problem in cases like this example in which a plurality (here, two) of the signal lines 2 are formed. Accordingly, the ground lines 3 are provided between the signal lines 2 in the transmission cable of the present embodiment in order to eliminate the cross-interference.

However, the ground lines 3 have a small effect when provided alone, and they must be grounded by some means. Accordingly, in the present embodiment, a shield layer 4, made from a copper foil or the like, is formed on a back surface of the insulating layer 1, metal bumps 5 are embedded penetrating the insulating layer 1, with the ground lines 3 electrically connected to the shield layer 4 via the metal bumps. The shield layer 4 is formed over approximately the entire back surface of the insulating layer 1, and grounded at some location thereof. Accordingly, the ground lines 3 are grounded by electrically connecting the ground lines 3 with the shield layer 4 via the metal bumps 5.

Here, as the metal bumps 5 are formed by etching a copper foil with the entirety being formed of metal materials, the metal bumps 5 have a far lower electrical resistance than, for example, conductive paste or the like, in which conductive particles are dispersed in a resin. Furthermore, the connection between the ground lines 3 and the metal bumps 5, and the connection between the shield layer 4 and the metal bumps 5 are all connections involving metal-to-metal contact. Accordingly, the connection resistance therebetween is low.

Accordingly, with the transmission cable configured as shown in FIG. 1, the ground lines 3 effectively function as shield between the signal lines 2, capable of reliably eliminating cross-interference between the signal lines 2 and the intrusion of noise, and capable of achieving a high-frequency transmission cable suitable for high speed transfer and large capacity transfer.

Figure 2A:
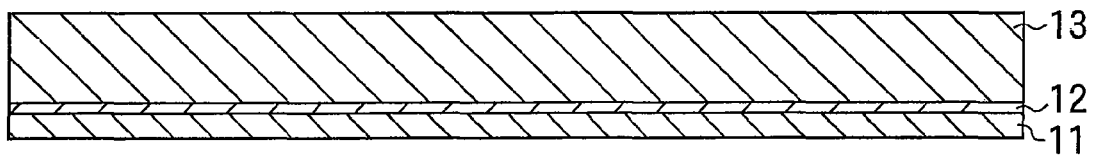
FIGS. 2a-2i are schematic cross-sections showing a relevant part of a manufacturing process of a transmission cable according to an embodiment.

Next, the method for manufacturing the transmission cable of FIG. 1 is described. To manufacture the transmission cable of FIG. 1, first, as shown in FIG. 2a, a clad material is prepared in which an etching barrier layer 12 and a bump copper foil 13 for forming the metal bumps 5 are laminated on a copper foil 11 corresponding to the shield layer 4. Here, the etching barrier 12 is made of, for example, Ni or a material containing Ni, and has etching selectivity with respect to the bump forming copper foil 13, acting as an etching stopper when etching the bump forming copper foil 13.

Figure 2B:
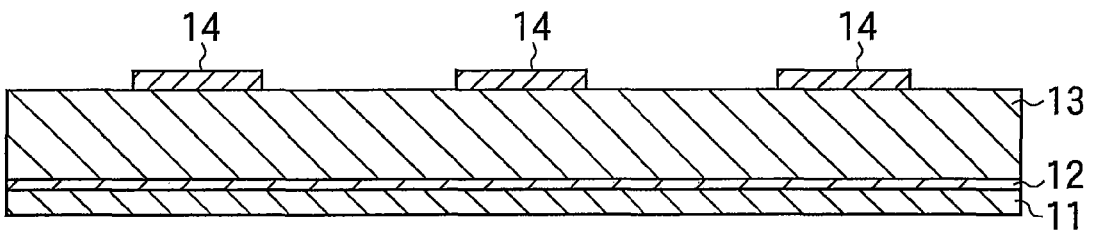

Next, metal bumps 15 are formed by etching the bump forming copper foil 13. The etching of the bump forming copper foil 13 is preferably performed by combining etching with acidic etching fluid and etching with an alkaline etching fluid. Specifically, as shown in FIG. 2b, a resist film 14 which will act as a mask is formed on the bump forming copper foil 13 and then sprayed with an acidic etching fluid (e.g., cupric chloride). The bump forming copper foil 13 is thereby etched, but within a range in which the etching depth by the acidic etching fluid is shallower than the thickness of the bump forming copper foil 13 so that the etching barrier layer 12 is not exposed.

Figure 2C:
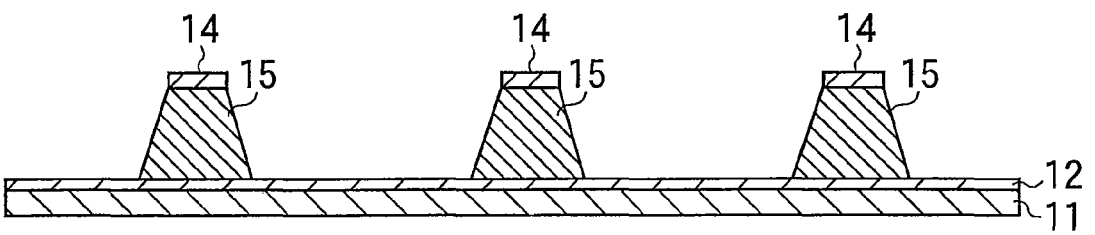

Next, after rinsing, the remaining portions of the bump forming copper foil 13 are etched with an alkaline etching fluid (e.g., ammonium hydroxide). The alkaline etching fluid almost completely does not penetrate the Ni which makes up the etching barrier layer 12, and, accordingly, the etching barrier layer 12 functions as a stopper in the etching with the alkaline etching fluid. Note that the pH of the alkaline etching fluid at this time is preferably not greater than 8.0. By using an alkaline etching fluid with this pH, it is possible to etch the bump forming copper foil 13 relatively quickly without penetrating the etching barrier layer 12. In this way, the metal bumps 15 are formed as shown in FIG. 2c.

Figure 2D:
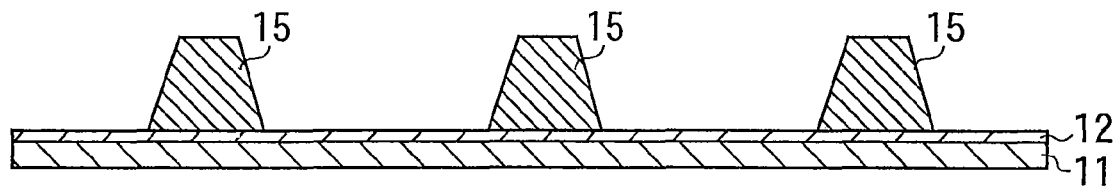
Figure 2E:
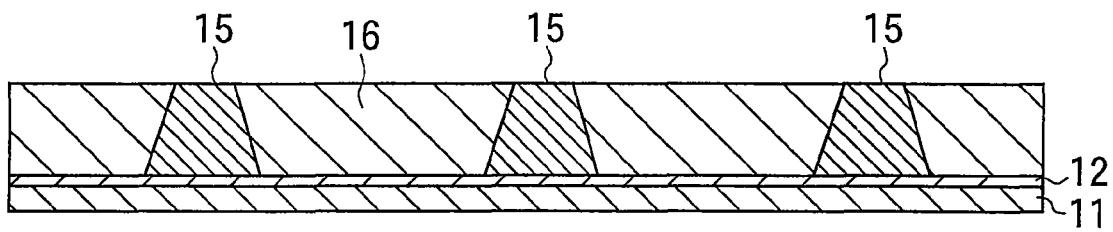
Figure 2F:
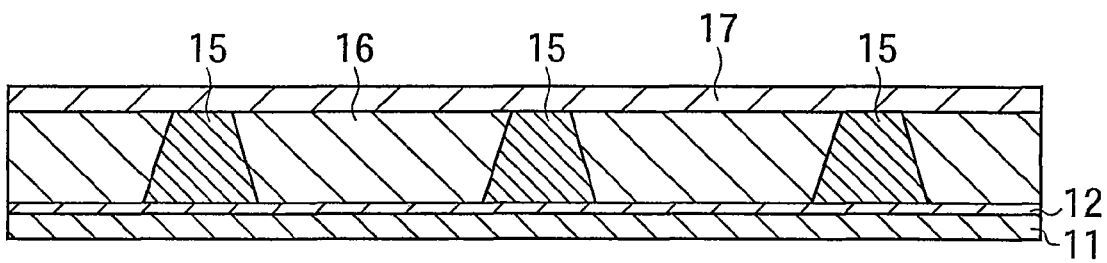

After the metal bumps 15 are formed, the resist film 14 remaining on the metal bumps 15 is removed, as shown in FIG. 2d, an insulating layer 16 is provided in the spaces between the metal bumps 15, as shown in FIG. 2e, and a wiring forming copper foil 17 is overlaid such that it touches top end surfaces of the metal bumps 15, as shown in FIG. 2f.

The insulating layer 16 can be formed by filling thermoplastic resin or the like, and it is preferably formed to a height slightly below the height of the metal bumps 15 to ensure contact between the metal bumps 15 and the wiring forming copper foil 17.

The wiring forming copper foil 17 is overlaid in order to be unified, but by sandwiching it between stainless plates, for example, at this time and pressurizing it by adding a predetermined pressure using a press machine, it is compressed together. By doing this, the top end surfaces of the metal bumps 15 are slightly crushed, thereby reliably contacting with the wiring forming copper foil 17, ensuring conduction. It is also possible to dispose an anisotropic conductive adhesion film or the like between the metal bumps 15 and the wiring forming copper foil 17 with the object of creating electrical continuity between the metal bumps 15 and the wiring forming copper foil 17.

Next, the wiring forming copper foil 17 is etched, forming wiring patterns, specifically signal lines and ground lines.

Figure 2G:
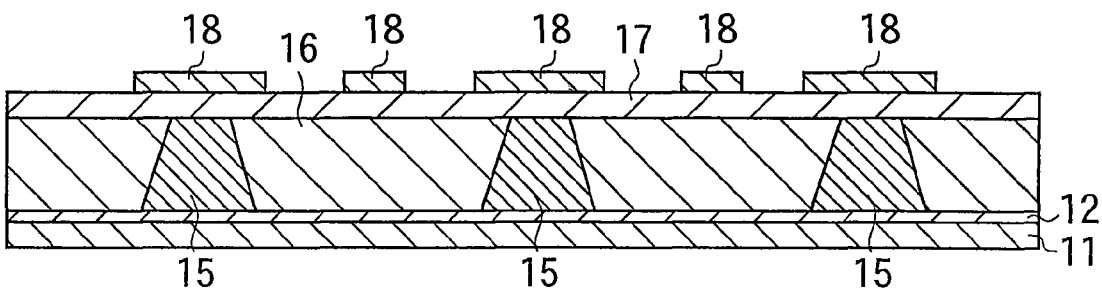

To form the wiring patterns, first, as shown in FIG. 2g, a resist layer 18 is formed in accordance with the patterns of the signal lines and the ground lines. The resist layer 18 can be formed using an ordinary photolithography technique, for example, resist material is provided over the entire surface, exposed, and developed so that the resist layer 18 with predetermined patterns can be remained.

Figure 2H:
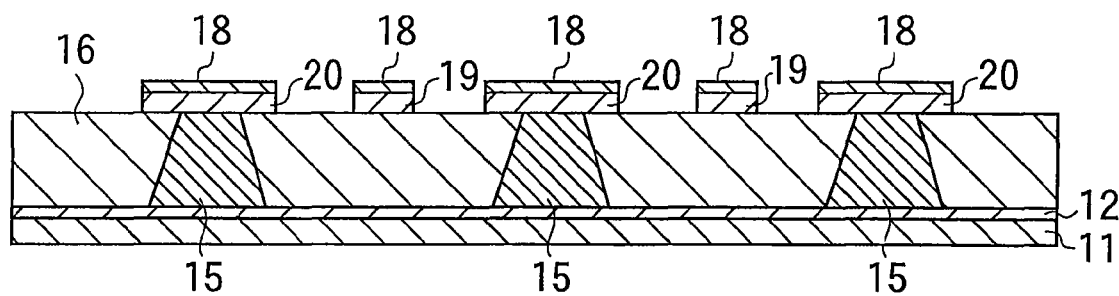
Figure 2I:
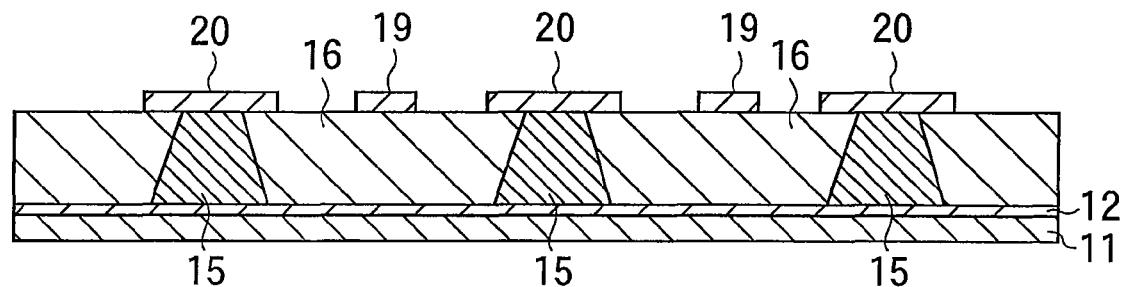

Next, etching is performed using the resist layer 18 as an etching mask, and signal lines 19 and ground lines 20 are patterned, as shown in FIG. 2h. The etching process here is similar to the etching process for forming wiring patterns in a manufacturing process for ordinary wiring substrates. Lastly, the resist layer 18 remaining on the signal lines 19 and the ground lines 20 is removed, as shown in FIG. 2i, and the transmission cable shown in FIG. 1 is complete.

With the manufacturing process described above, the metal bumps 15 are formed by etching the bump forming copper foil 13. Etching is a common technology for patterning wiring, etc., and the metal bumps 15 can easily be formed without using special equipment or technology by, for example, using existing etching tanks and other manufacturing equipment, and, further, a photolithography technique and the like. Since the metal bumps 15 are piled onto the copper foil 11 as a clad material, the electrical connection with the copper foil 11, which acts as the shield layer, is good, and they are also pressure bonded to the wiring forming copper foil 17, creating a good connection with the ground lines 20 as well.

The above is a description of an embodiment of the transmission cable and the manufacturing method thereof according to the present invention, but the present application is not limited to this, and a variety of changes are possible.

Figure 3:
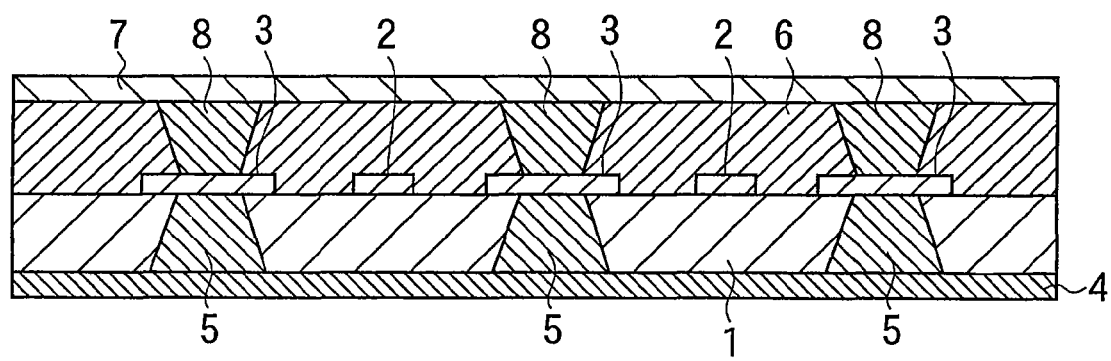
FIG. 3 is a schematic cross-section showing a relevant part of an example of a completely shielded transmission cable.

For example, as shown in FIG. 3, it is possible to provide shield layers to either side, completely shielding the area surrounding the signal lines. To describe the construction of the transmission cable shown in FIG. 3, the construction from the signal lines 2 and the ground lines 3 and below is the same as the example above shown in FIG. 1. Specifically, the signal lines 2 and the ground lines 3 are formed on the upper surface of the insulating layer 1, while the shield layer 4 is provided to a back (bottom) surface of the insulating layer 1, so that the shield layer 4 and the ground lines 3 are electrically connected by the metal bumps 5.

In the example shown in FIG. 3, the same construction as this is formed above the signal lines 2 and the ground lines 3 as well. Specifically, a second insulating layer 6 is formed covering the signal lines 2 and the ground lines 3, and a second shield layer 7 is formed above that. The second shield layer 7 and the ground lines 3 are electrically connected by metal bumps 8 similar to the above-described metal bumps 5.

To make the transmission cable shown in FIG. 3, a step of overlaying a clad material on which metal bumps are formed, on a surface on which the signal lines 2 and the ground lines 3 are formed, need only be added to the process shown in FIG. 2 above. A clad material on which an insulating layer as shown in FIG. 2e is formed is flipped upside down and disposed so that the metal bumps 15 are below, its top end contacted with the ground lines 3 and pressure-bonded. Thus, the signal lines 2 and the ground lines 3 are sandwiched between the upper and below shield layers 4 and 7, and a transmission cable is formed with a construction in which the shield layers 4 and 7 are connected to the ground lines 3 by the metal bumps 5 and 8. This transmission cable has a three-layer construction, a completely shielded construction in which the area surrounding the signal lines 2 is completely shielded, so that an ultra-high frequency transmission cable is built. Even more layers can be added using the same method, making it possible to realize a transmission cable capable of ultra high speed large capacity transmission.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention is claimed as follows:

1. A transmission cable having:
    a plurality of signal lines;
    a plurality of ground lines positioned between the signal lines;
    a first insulating layer having the signal lines and the ground lines formed on its one side;
    a first metal bump composed of a patterned first copper foil and embedded in the first insulating layer; and
    a first shield layer formed on the other side of the first insulating layer,
    wherein the ground lines are electrically connected with the first shield layer through the first metal bumps,
    wherein the first shield layer has a second copper foil and an etching stopper layer of which laminated on the second copper foil and connected to the first metal bump, and
    wherein the etching stopper layer is made of a material of which does not etched by alkaline etching fluid having pH 8 or lower, and the first metal bump is electrically connected to the second copper foil via the etching stopper layer.

2. The transmission cable according to claim 1, further having:
    a second insulating layer having the signal lines and the ground lines formed on its one side;
    a second metal bump embedded in the second insulating layer; and
    a second shield layer formed on the other side of the second insulating layer,
    wherein the ground lines are electrically connected with the second shield layers via the second metal bumps.

* * * * *